(12) United States Patent
Shiina et al.

(10) Patent No.: US 12,094,687 B2
(45) Date of Patent: Sep. 17, 2024

(54) PLASMA PROCESSING APPARATUS AND PLASMA PROCESSING METHOD

(71) Applicant: HITACHI HIGH-TECH CORPORATION, Tokyo (JP)

(72) Inventors: Masayuki Shiina, Tokyo (JP); Naoki Yasui, Tokyo (JP); Tetsuo Ono, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 297 days.

(21) Appl. No.: 17/464,816

(22) Filed: Sep. 2, 2021

(65) Prior Publication Data

US 2021/0398777 A1    Dec. 23, 2021

Related U.S. Application Data

(62) Division of application No. 15/260,512, filed on Sep. 9, 2016, now Pat. No. 11,417,501.

(30) Foreign Application Priority Data

Sep. 29, 2015  (JP) ................................. 2015-190623
Jun. 29, 2016  (JP) ................................. 2016-128288

(51) Int. Cl.
*H01J 37/32*        (2006.01)
*H01L 21/263*      (2006.01)
(Continued)

(52) U.S. Cl.
CPC .. *H01J 37/32165* (2013.01); *H01J 37/32082* (2013.01); *H01J 37/32091* (2013.01);
(Continued)

(58) Field of Classification Search
None
See application file for complete search history.

(56) References Cited

U.S. PATENT DOCUMENTS 5,983,828 A    11/1999  Savas
6,489,245 B1   12/2002  Winniczek et al.
(Continued)

FOREIGN PATENT DOCUMENTS

CN       103098559       5/2013
JP       08-45903        2/1996
(Continued)

OTHER PUBLICATIONS

Taiwanese Office Action received in corresponding Taiwanese Application No. 105126591 dated Apr. 26, 2017.
(Continued)

*Primary Examiner* — Jiong-Ping Lu
(74) *Attorney, Agent, or Firm* — MATTINGLY & MALUR, PC

(57) ABSTRACT

The plasma processing apparatus has a plasma processing chamber where plasma processing of the sample is performed, and plasma power supply that supplies radio frequency electric power for generating plasma. The radio frequency electric power is time modulated by a pulse wave having a first period and a second period that are repeated periodically. The pulse wave of the first period has first amplitude and the pulse wave of the second period has second amplitude which is a limited value smaller than the first amplitude. The extinction of the plasma, which is generated during the first period having the first amplitude, is maintained during the second period having the second amplitude with a predetermined dissociation.

13 Claims, 11 Drawing Sheets

(51) Int. Cl.
*H01L 21/3115* (2006.01)
*H01L 21/3213* (2006.01)
*H01L 21/67* (2006.01)
*H01L 29/66* (2006.01)

(52) U.S. Cl.
CPC .. *H01J 37/32137* (2013.01); *H01J 37/32146* (2013.01); *H01J 37/32174* (2013.01); *H01J 37/32192* (2013.01); *H01J 37/32311* (2013.01); *H01J 37/3244* (2013.01); *H01L 21/2633* (2013.01); *H01L 21/31155* (2013.01); *H01L 21/32136* (2013.01); *H01L 21/32137* (2013.01); *H01L 21/67069* (2013.01); *H01L 29/66795* (2013.01)

(56) References Cited

U.S. PATENT DOCUMENTS

| 6,875,700 | B2 | 4/2005 | Kanakasabapathy et al. |
| 2002/0115301 | A1* | 8/2002 | Savas ............... H01J 37/321 156/345.48 |
| 2004/0157459 | A1 | 8/2004 | Mng et al. |
| 2007/0072435 | A1 | 3/2007 | Kumar |
| 2010/0243607 | A1 | 9/2010 | Ohse et al. |
| 2010/0248489 | A1 | 9/2010 | Koguchi et al. |
| 2011/0256732 | A1 | 10/2011 | Maynard et al. |
| 2013/0001197 | A1 | 1/2013 | Inoue et al. |
| 2013/0045604 | A1 | 2/2013 | Maeda et al. |

FOREIGN PATENT DOCUMENTS

| JP | 09-185999 | 7/1997 |
| JP | 2001-358129 | 12/2001 |
| JP | 2008-103428 | 5/2008 |
| JP | 2010-021442 | 1/2010 |
| KR | 10-2010-0109513 | 10/2010 |
| TW | 201118943 | 6/2011 |
| TW | 201301381 | 1/2013 |
| WO | 2011/016266 | 1/2013 |

OTHER PUBLICATIONS

Japanese Office Action received in corresponding Japanese Application No. 2016-128288 dated Jul. 2, 2019.

Korean Office Action received in corresponding Korean Application No. 10-2016-0098408 dated Jul. 31, 2017.

* cited by examiner

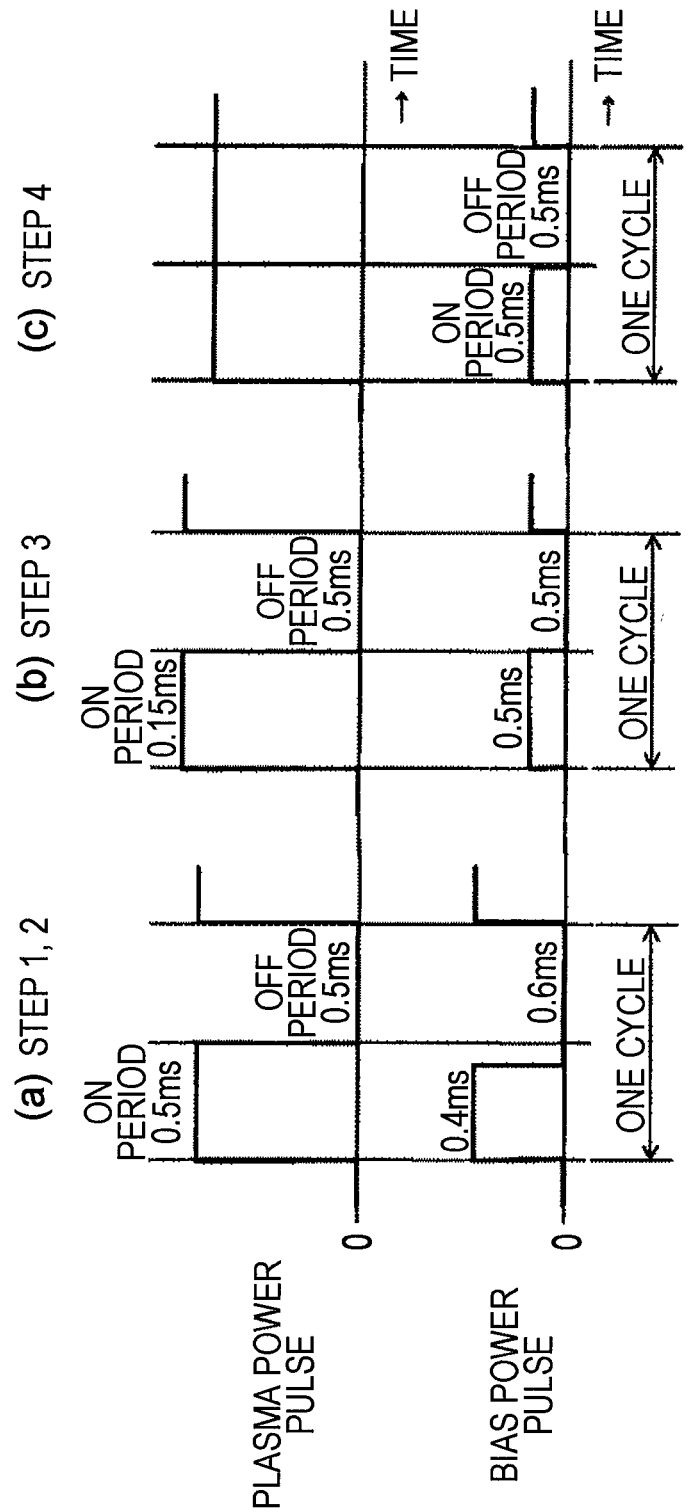

PLASMA PROCESSING APPARATUS AND PLASMA PROCESSING METHOD

BACKGROUND OF THE INVENTION

The present invention relates to a plasma processing apparatus and a plasma processing method suitable for plasma processing using pulse discharge.

Mass-production of three dimensional structure transistors called Fin-FET (Fin Field Effect Transistor) are beginning with the micronization of semiconductor devices. To manufacture this kind of semiconductor devices, a dry etching technology is required to satisfy a further micronization, a higher aspect, and a highly precise etching for a complicated profile which is not seen in the conventional two dimensional transistors.

For example, an etching domain becomes smaller when a trench of a line reaches a certain depth during a dummy gate etching of Fin-FET. Usually, the area between the lines becomes the etching domain; however, in this case, a narrow area surrounded by the exposed Fin and the line turns to be the etching domain. A broader process window is therefore required for the plasma processing apparatus for a dry etching for such profile.

One technology for realizing a highly precise plasma etching is a plasma etching method using pulse discharge. For example, JP-A-H09-185999 discloses a method for controlling density and composition of radical by: measuring the density and composition of radical generated by decomposition of plasma reactant gas; pulse modulating the electric power of a plasma generation apparatus with a constant cycle and; controlling duty ratio of the pulse modulation based on the measured result.

U.S. Pat. No. 6,489,245 B discloses a method for reducing a mask corrosion during the etching by alternating high electric power cycle and low electric power cycle of discharge electric power with a certain pulse frequency such that a polymer accumulates on the mask during the low electric power cycle.

JP-A-2010-021442 discloses a method for forming a via of high aspect ratio on a silicon substrate by: supplying alternately the high electric power and low electric power to an antenna; forming protective film with sputtering during the high electric power period; performing etching processing during the low electric power period and; repeating the etching process and the protective film formation process alternately.

JP-A-H08-045903 discloses a method for performing a clean and reproducible etching so as to prevent an adsorption and deposition of an etching reaction product on a wall face of a processing chamber by modulating ON/OFF of both the bias electric power and the discharge electric power, but not turning both of them ON at the same time.

SUMMARY OF THE INVENTION

In the etching processing using pulse discharge disclosed in each literature above, plasma is generated during the etching, in other words, highly dissociated plasma is utilized for etching.

Therefore, in order to realize an etching processing adaptable for forming a three dimensional device such as Fin-FET, where the etching area becomes smaller due to change of etching domain or the aspect ratio becomes higher during the etching, the control of the radical deposition is important which largely effects the control of vertical profile. However, the process window for controlling the amount of radical deposition is not sufficient.

Specifically, in the device using ECR discharge disclosed in JP-A-H09-185999, the adjustment of the adherence probability of radical deposition is not sufficient because high density plasma that is highly dissociated is generated, and is difficult to generate lowly dissociated plasma.

The purpose of the present invention is to provide a plasma processing apparatus and the method that can broaden the process window by controlling the plasma dissociation.

Another purpose of the present invention is to provide an etching processing apparatus and an etching method that is adaptable for microfabrication etching and can perform vertical etching even when an etching surface has a difference between isolation pattern and dense pattern.

Another purpose of the present invention is to provide an etching processing apparatus and an etching method that is adaptable for an etching where the etched profile turns smaller during its process.

The above object of the present invention can be achieved by providing a plasma processing apparatus including: a plasma processing chamber that generates plasma inside and performs plasma processing of a sample; a power supply for plasma generation that supplies radio frequency electric power for generating the plasma; a bias power supply, arranged inside the plasma processing chamber, that supplies radio frequency electric power for bias to a sample stand for mounting the sample; and a controller, wherein the controller is configured to time modulate periodically the radio frequency electric power for generating the plasma using a pulse wave of first period and a pulse wave of second period, wherein the pulse wave of the first period supplies radio frequency electric power of first amplitude capable of generating the plasma, and wherein the pulse wave of the second period supplies radio frequency electric power of second amplitude smaller than the first amplitude capable of maintaining after-glow of the plasma, time modulate periodically the radio frequency electric power for the bias between an electric power supplying period and an electric power terminating period, adjust the electric power supplying period of the radio frequency electric power for the bias to the second period of the radio frequency electric power for generating the plasma, and control the electric power supplying period of the radio frequency electric power for the bias so as to be shorter than the second period.

Another object of the present invention can be achieved by providing a plasma processing method wherein gas inside a processing chamber is turned to plasma periodically, and a sample inside the processing chamber is processed using the plasma, including: supplying alternately a first radio frequency electric power value for turning the gas into plasma and a second radio frequency electric power value for maintaining after-glow of the plasma generated by the first radio frequency electric power value in an arbitrary state periodically, the second radio frequency electric power value being smaller than the first radio frequency electric power value; and supplying bias power for entering ion of the after-glow state into the sample while the second radio frequency electric power value is supplied.

The present invention allows broadening the process window by controlling the plasma dissociation.

BRIEF DESCRIPTION OF THE DRAWINGS

FIG. 11 is a timing chart illustrating a supplying state of the plasma power and the bias power of Table 4 according to a comparative example of the second embodiment of the present invention;

DESCRIPTION OF THE EMBODIMENTS

The present invention relates to a plasma processing apparatus and a method that can perform a lowly dissociated plasma processing. The invention will be discussed first with reference to FIG. 1 through FIG. 4.

Figure 1:
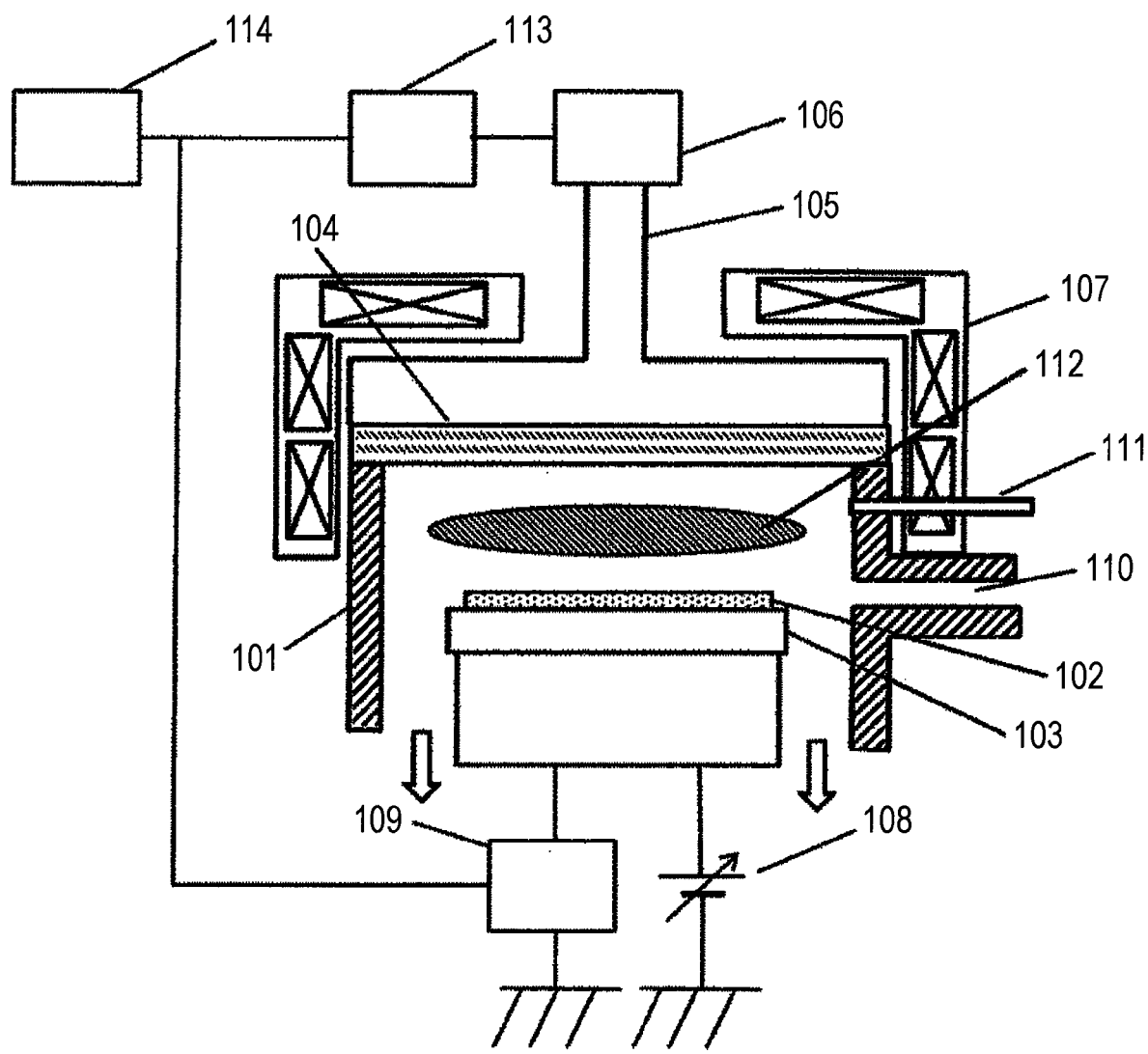
FIG. 1 is a longitudinal sectional view illustrating a plasma etching apparatus according to the present invention.

FIG. 1 illustrates a magnetic field microwave plasma etching apparatus as an example of the plasma processing apparatus of the present invention. A sample stand 103 for arranging a wafer 102, which is a sample, is arranged inside a chamber 101 that forms a plasma processing chamber, where the room is decompressed by exhausting the gas. A wave guide tube 105 and a magnetron 106 oscillating a microwave are arranged in this order on the upper opening of the chamber 101 intervening a microwave transmission window 104.

A first radio frequency power supply 113, which is a power supply for plasma generation for supplying radio frequency electric power, is connected to the magnetron 106. A solenoid coil 107 for forming a magnetic field inside the chamber 101 is provided in the perimeter of the chamber 101 and the wave guide tube 105. A gas introduction port 111 is connected to the chamber 101, and a gas for etching processing is supplied from a processing gas supplying apparatus (not illustrated). The processing gas supplied into the chamber 101 is excited by an interaction between a microwave electric field from the magnetron 106 and a magnetic field from a solenoid coil 107 to form plasma 112 inside the chamber 101.

The chamber 101 has a wafer conveyance port 110 for carrying in/out the wafer 102. The wafer 102 is carried into the chamber 101 by a conveying apparatus (not illustrated) through the wafer conveyance port 110. The wafer 102 is arranged on the sample stand 103. The sample stand 103 is arranged with a static electricity zipper for holding the wafer by absorption and is connected with a static electricity adsorption power supply 108. The sample stand 103 is also connected with a second radio frequency power supply 109, which is bias power supply for introducing ion inside the plasma into the plasma processing wafer. The bias power supply is controlled so that voltage between bias peaks of the radio frequency electric power applied to the sample stand becomes constant during an electric power supplying period.

Figure 2:
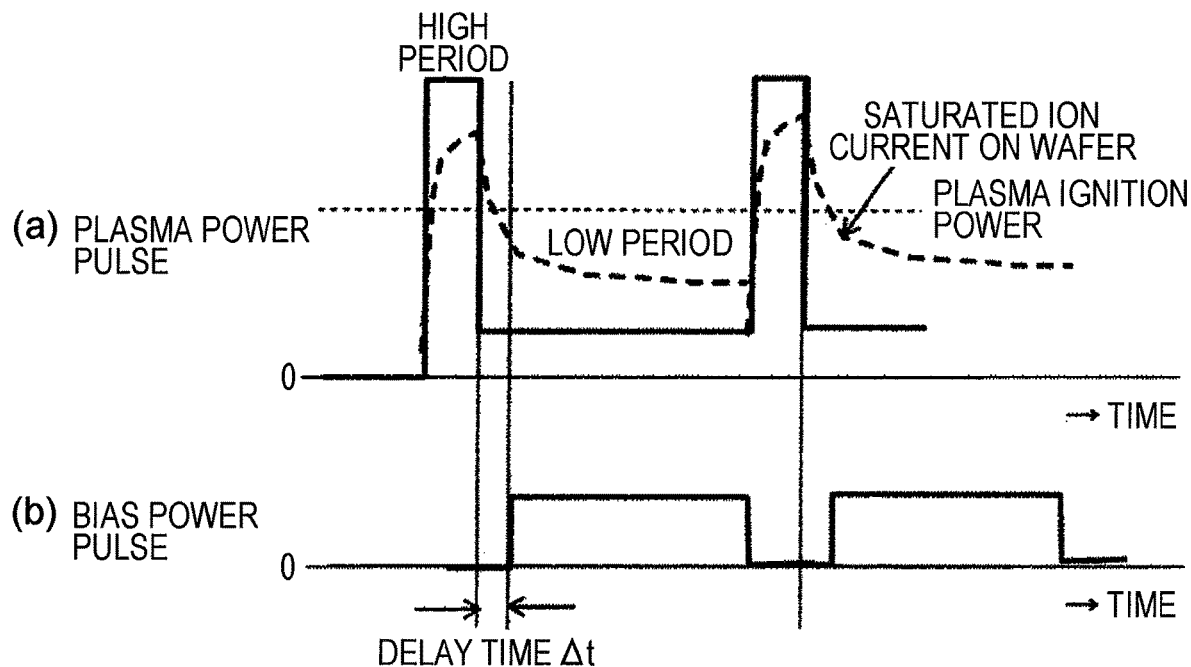
FIG. 2 is a timing chart illustrating supply of plasma power and bias power according to the present invention.

The first radio frequency power supply 113 and the second radio frequency power supply 109 are connected with a controller 114, and are controlled radio frequency electric power outputs respectively. As illustrated in FIG. 2, the controller 114 can control the pulse-output of plasma generation electric power and bias power. The applying timing of one of the electric powers can be delayed, and each electric power can be synchronized. The controller also has a delay circuit that delay controls the start of the electric power supplying period of the radio frequency bias power against a second period of the radio frequency plasma generation electric power.

The controller turns OFF the output of the bias power supply when the voltage between the bias peaks of the radio frequency electric power supplied to the sample stand reaches a predetermined value. FIG. 2 (a) illustrates a pulse wave for controlling an output value and an output timing from the first radio frequency power supply 113. One cycle of the pulse wave includes "high period" where a high output value is maintained and "low period" where a small output value is maintained. These two periods are repeated alternatively.

FIG. 2 (b) illustrates a pulse wave for controlling an output value and an output timing from the second radio frequency power supply 109. The pulse wave is synchronized with the plasma power pulse and a bias power pulse is generated following the end of the high period of a cycle with delay of Δt. The bias power pulse is generated only during the low period of the plasma power pulse.

Figure 3:
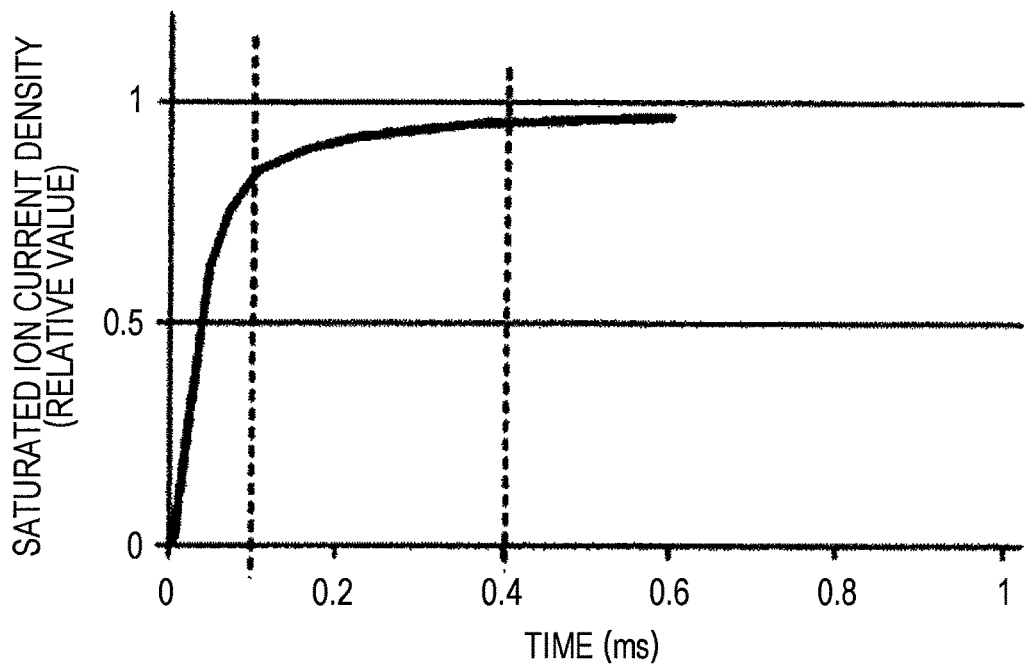
FIG. 3 is a figure illustrating a relation between a saturation ion current density and a time during a plasma generation.

FIG. 2 (a) illustrates the plasma power pulse wave in solid line and the corresponding saturation ion current in dashed line that is measured on the wafer. The plasma power during the high period allows plasma ignition, and the saturation ion current increases rapidly during this period. FIG. 3 illustrates a saturation ion current density. The current density increases with the plasma ignition and approaches to a saturated state in about 0.1 ms, and reaches the saturation state substantially in about 0.4 ms. This indicates that the high ion-density plasma, or high electron density plasma can be obtained when the high period is set within 0.1 ms to 0.4 ms.

Figure 4:
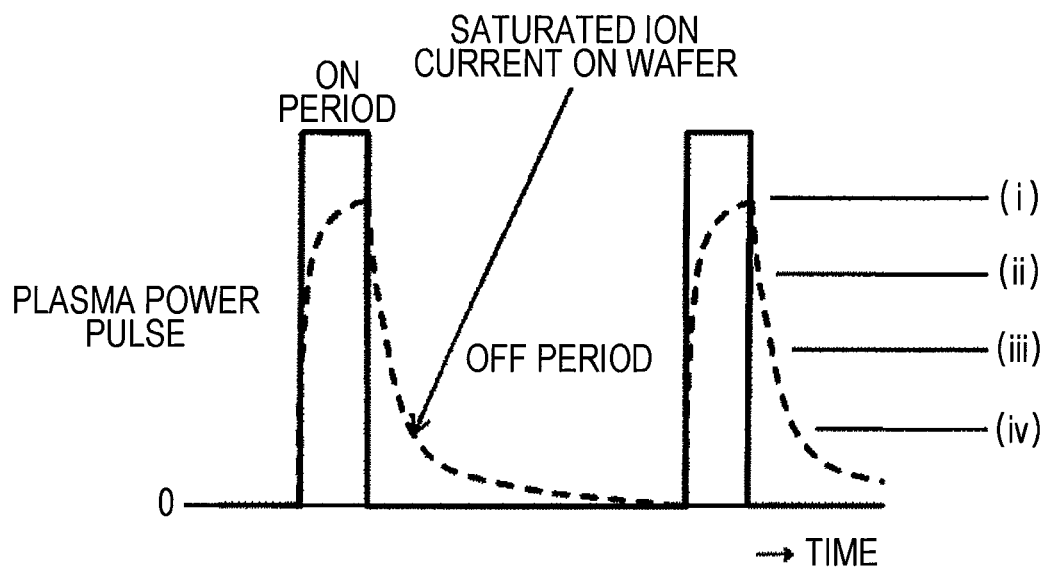
FIG. 4 is a figure illustrating a saturation ion current density when a pulsed plasma power is turned ON/OFF.

The electron acts on plasma dissociation. During the high period, a highly dissociated plasma can be obtained because a radio frequency electric power with high power is supplied to the plasma, which will be the energy for raising plasma dissociation in the electron, and the electron temperature is increased. When the pulse output during the high period is terminated, the saturation ion current starts decreasing because plasma power is no longer supplied as illustrated in FIG. 4. Generally, the plasma turns substantially to an extinguished state in about 0.2 ms, although it depends on a saturation ion current density value, a kind of gas, and an existence of magnetic field when the plasma is generated.

A plasma state so called after-glow is seen before the saturation ion current becomes zero, i.e., the plasma extinguishes. In the after-glow state, plasma dissociation decreases as the time elapses. Conceptually, in case of a methane (CH4) gas, when the saturation ion current is in the state (i) where the plasma power is in ON (high) period as illustrated in FIG. 4, the collision frequency of the gas and the electron increases and the dissociation progresses such as to CH+3H.

In the state (ii), where the plasma power is in OFF period, the collision frequency of the gas and the electron decreases, and lowly dissociated substance such as CH2+2H increases. In state (iii), where the plasma power is in OFF period, the collision frequency of the gas and the electron decreases further, and further lowly dissociated substance such as CH3+H increases. In state (iv), where the plasma power is in OFF period, the collision frequency of the gas and the electron further decreases, and substance such as CH4 increases which is same to the gas condition during the supplying period.

The saturation ion current density is high immediately after the end of the high period. After a certain time has elapsed, the dissociation is decreased and the saturation ion current density decreases to less than half. In the present embodiment, the plasma power pulse, which is controlled to a low power such that the plasma does not ignite, is output from the controller 114 to the first radio frequency power supply 113 after the high period as illustrated in FIG. 2. As a result, a lowly dissociated plasma can be maintained, where the saturation ion current value is in a predetermined range, without extinguishing the after-glow.

When a lowly dissociated plasma is maintained during the low period where a low power plasma power pulse is output, (in other words, when the saturation ion current value is in predetermined value or less during the low period), a pulse signal is output from the controller 114 to the second radio frequency power supply 109 so as to apply bias power to the sample stand 103 from the second radio frequency power supply 109.

The wafer 102 can thereby be plasma processed with the lowly dissociated plasma. The ion in the after-glow state can be affected by the bias power, where the ion is in arbitrary dissociated plasma state, by controlling the delay time Δt for allowing a use of plasma suitable for processing a target object. Further, an impedance matching of the bias power applied from the second radio frequency power supply 109 is performed by a matching unit (not illustrated) when the plasma of the low period turns stable.

Figure 5:
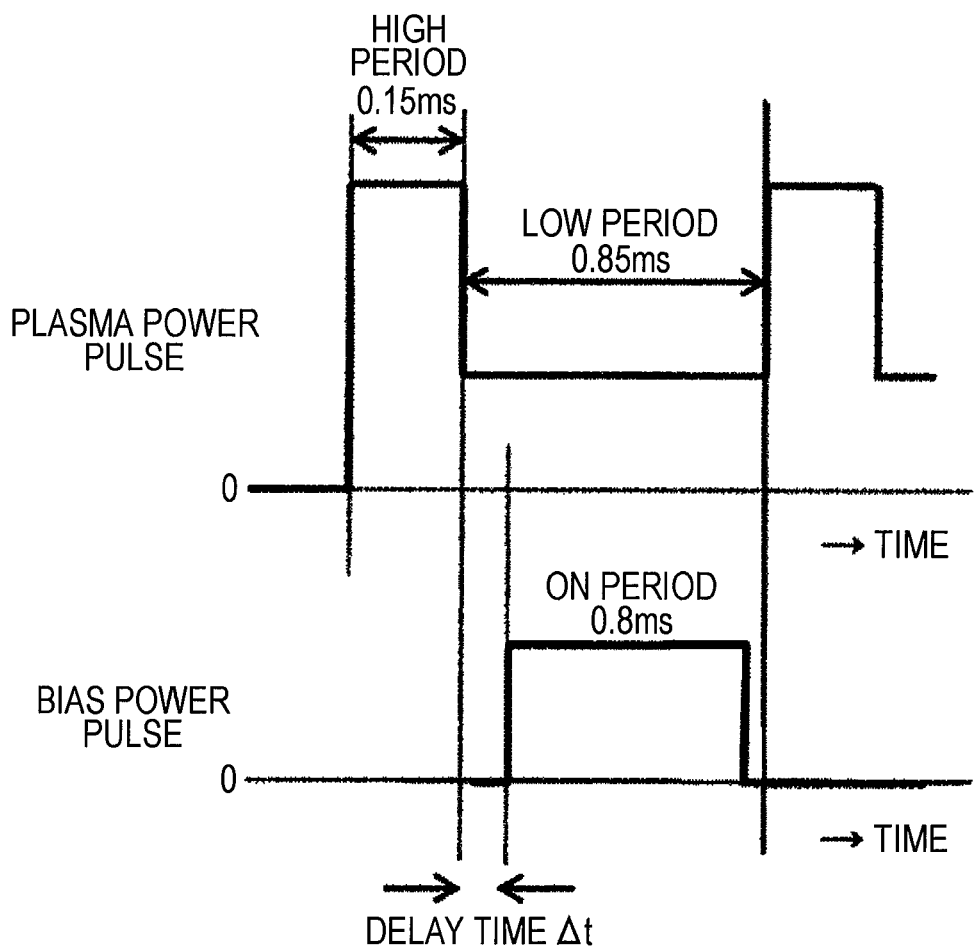
FIG. 5 is a timing chart illustrating a supplying state of plasma power and bias power according to the plasma processing method (Table 1) of a first embodiment of the present invention.

The first embodiment of the present invention will be discussed with reference to FIG. 5 and FIG. 6.

Etching processing of Poly-Si film using a device illustrated in FIG. 1 under conditions shown in Table 1 will be discussed.

TABLE 1

| etching time | 32 sec |
|---|---|
| processing gas | CL2 |
|  | O2 |
|  | HBr |
|  | Ar + CH4 |
| processing pressure | 0.3 Pa |
| plasma power/ | high period 750 W/15%/0.15 ms |
| duty/time | low period 200 W/85%/0.85 ms |
| bias power/duty | low period 120 W/80% |

In this case, a mixed gas of Cl2, O2, HBr, and Ar+CH4 gases is used as a processing gas for the etching processing. In this gas system, a methane (CH4) gas is mixed to prevent a side etching of a side wall of the Poly-Si film. The microwave power for plasma generation is set to high and low values and are time modulated and supplied alternatively as shown in FIG. 5. The parameters of the microwave power are 750 W and 200 W each having duty of 15% and 85% and frequency is 1 kHz as shown in Table 1.

In the present apparatus, the 2.45 GHz microwave is used as plasma power source, and plasma is ignited when the output is approximately 400 W or more. The bias power is synchronized with the plasma power with frequency of 1 kHz so that the bias power is supplied only during a low period of the plasma power, and is supplied with duty of 80%. In this case, the delay time Δt is 0.05 ms.

Figure 6:
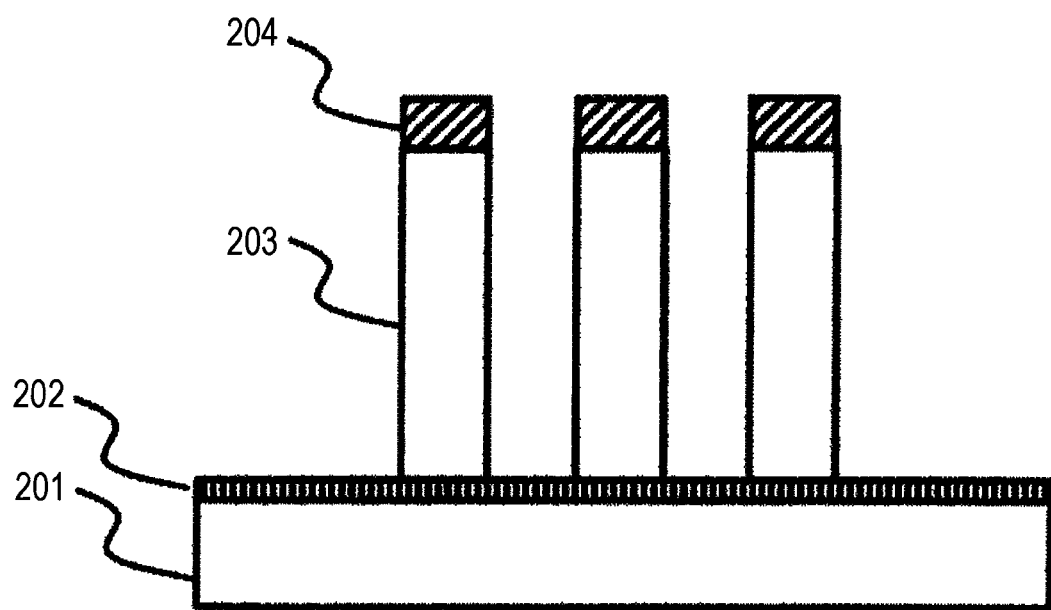
FIG. 6 is a longitudinal sectional view illustrating an etching profile of a sample processed by the etching condition of Table 1 using the electric power of FIG. 5.

FIG. 6 illustrates a sectional view of the wafer which is etch processed under the conditions mentioned above. In this case, the wafer has a structure where an oxide film 202 of 5 nm, a Poly-Si film 203 of 50 nm, and a nitride film mask 204 of 10 nm are accumulated on a Si substrate 201. FIG. 6 is a sectional view of lines and spaces of Poly-Si film after the etching. The etching progresses during the low period according to the etching processing of the present embodiment.

The plasma power during the low period is 200 W where the plasma is unable to be generated and maintained with an ordinary continuous discharge. However, the plasma generated in the high period can be maintained for a short period until the next high period. During this low period, low plasma density can be maintained.

If the plasma density is low, the collision frequency of an electron and a radical decreases. As a result, CH3 becomes a dominant radical in the plasma with a comparatively low adhesion coefficient. When the adhesion coefficient is low, the radical does not adhere to the surface first landed to, and the radical tends to go toward the rear side of the line. The amount of the radical adhesions in the interval area of the lines of the Poly-Si film 203 become closer between the broader area and the narrower area. As a result, a vertical profile is obtained in the side wall having a broader space facing the line. In other words, the outer side surface of the line is prevented from being thick as illustrated in FIG. 6.

As a comparative example of the first embodiment of the present invention, an etching processing of the similar Poly-Si film under conditions shown in Table 2 will be discussed.

TABLE 2

| etching time | 19 sec |
|---|---|
| processing gas | CL2 |
|  | O2 |
|  | HBr |
|  | Ar + CH4 |
| processing pressure | 0.3 Pa |
| plasma power/duty/time | 750 W/100% |
| bias power/duty | 120 W/100% |

Figure 7:
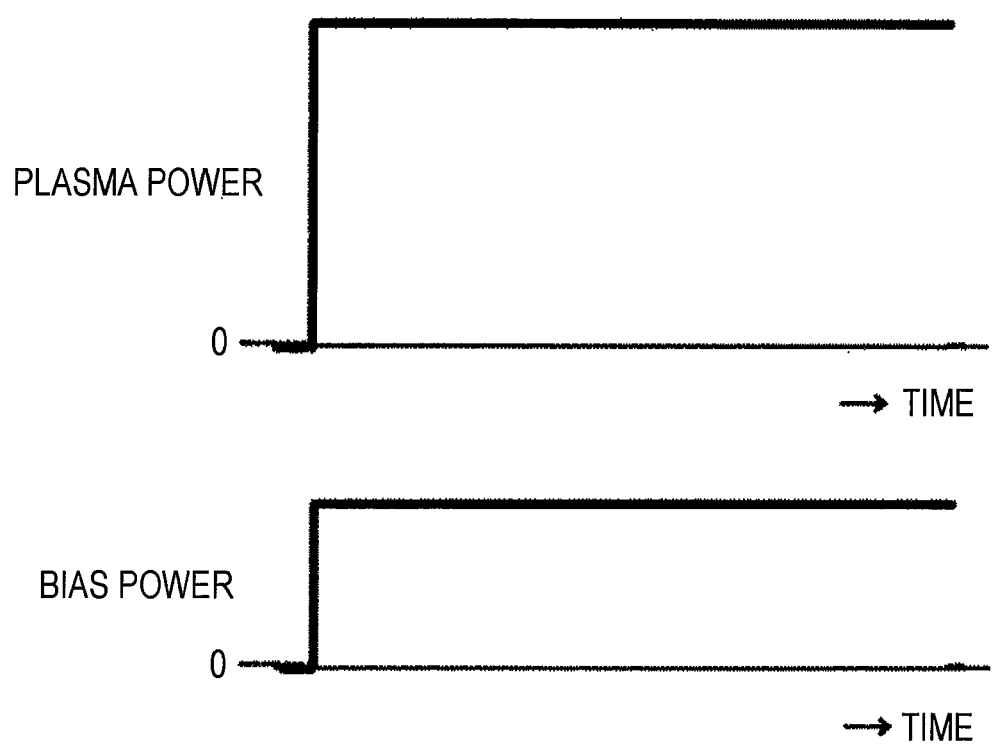
FIG. 7 is a timing chart illustrating a supplying state of the plasma power and the bias power of Table 2 according to a comparative example of the first embodiment of the present invention.

Compared to the etching processing of the first embodiment, the plasma power and the bias power are not time modulated in this comparative example, and are supplied continuously as illustrated in FIG. 7. Therefore, the etching of the Poly-Si film progresses continuously and the etching time becomes shorter compared with the first embodiment.

Figure 8:
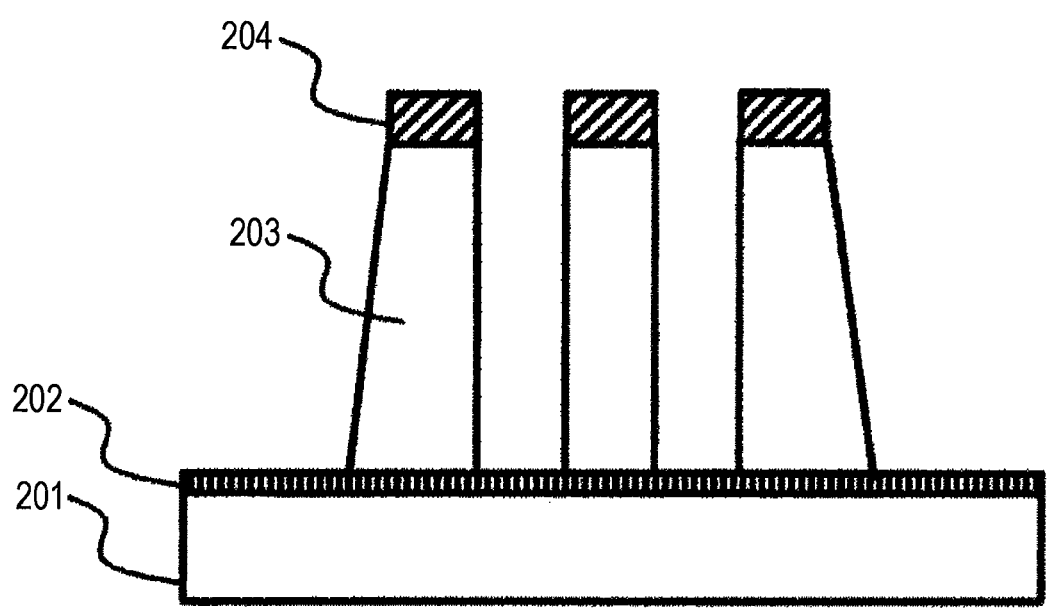
FIG. 8 is a longitudinal sectional view illustrating an etching profile of a sample processed by the etching condition of Table 2 using electric power of FIG. 7.

FIG. 8 illustrates a sectional view of the wafer which is etch processed under the conditions mentioned above. Since the components having the same reference number as in the FIG. 6 are the same, the detailed description are omitted. In the present comparative example, the plasma power is large when bias power is applied for etching processing and plasma density becomes large during this period. In this gas system, a methane (CH4) gas is mixed for reducing the side etching of the Poly-Si film side wall as discussed above.

Therefore, the number of CH radicals with high adhesion coefficient (radicals with large number of unconnected bonds) increases when the plasma density is high. This is because the collision frequency of the methane gas and the electron increases and a dissociation progresses such as from CH4 to CH+3H. When there are many high adhesive coefficient radicals, a tapered profile as illustrated in FIG. 8 is made. This is because the collision frequency of the radical increases at the side wall of the line having a broader space facing the side wall of the Poly-Si film 203, and this side wall facing the broader space becomes thicker.

Therefore, the first embodiment allows an etching processing with lowly dissociated plasma and can control the adhesive probability of the accumulative radicals. This because the plasma in the after-glow state, where the plasma is generated during the high period, can be used for the processing. Therefore, the adhesive condition of the accumulative radical can be optimized even when the etching object has a large difference between isolation pattern and dense pattern in the line width, and allows a vertical etching processing of the side walls of the lines having a difference between isolation pattern and dense pattern.

As discussed above, the process window of the processing apparatus can be broadened even when the processing using an ordinary plasma generation is difficult. This is because a lowly dissociated plasma can be used for the processing. The broadened process window allows an etching processing with a sufficient profile control.

Further, according to the first embodiment, the after-glow state during an unstable period, where the plasma is extinguishing, can be maintained stably. This is because a predetermined plasma power, which is smaller than that of high period, is supplied during the low period in the after-glow state of plasma generated during the high period. This stabilizes an etching processing which is performed by applying bias power during the low period.

The use of a magnetic field microwave plasma processing apparatus, as the plasma processing apparatus, allows processing under a high vacuum condition compared with the capacitive coupling method or the inductive connection method plasma processing apparatus because this apparatus can generate ECR plasma. The high vacuum state is advantageous for using after-glow state plasma because the collision probability of ions and radicals is less.

The ECR plasma allows broadening the range of the saturation ion current density between the high state and the low state because the ECR plasma can form a high-density plasma compared with the other types of plasma. In other words, setting range of the electric power output value for the low period, which is used for plasma processing, can be broadened, and the processing window can thereby be broadened.

A second embodiment of the present invention will be discussed with reference to FIG. 9 and FIGS. 10A to 10C.

Figure 10A:
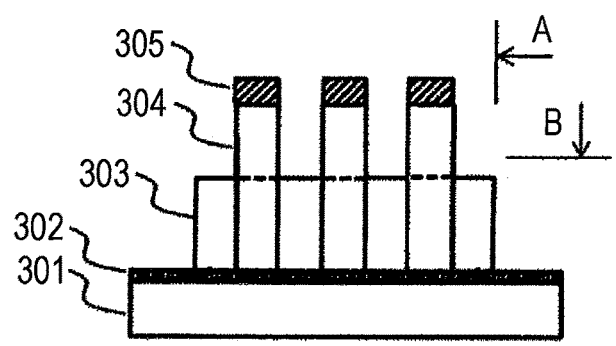
FIGS. 10A to 10C are longitudinal sectional views illustrating an etching profile of a sample processed by the etching condition of Table 3 using electric power of FIG. 9.
Figure 10B:
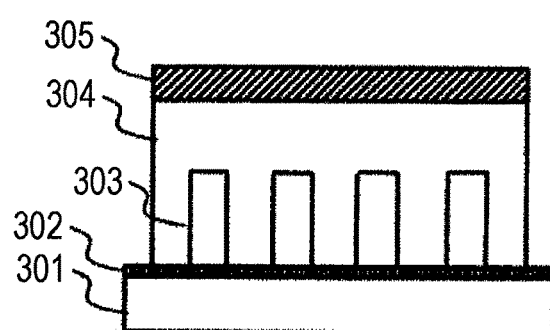
Figure 10C:
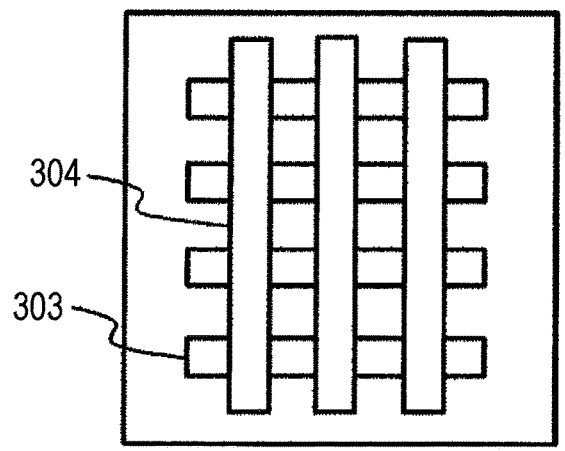

An etching processing of three dimensional structure Fin-FET using the apparatus illustrated in FIG. 1 under conditions of Table 3 will be discussed. In this case, the Fin-FET has a structure where an oxide film 302 of 5 nm, a Poly-Si film 304 of 150 nm, and a nitride film 305 of 10 nm are accumulated on a Si substrate 301 as illustrated in FIG. 10. The Poly-Si film 304 is layered so as to range over the Fin 303 on the oxide film 302. FIG. 10B is a figure viewed from the direction A in the FIG. 10A, and FIG. 10C is a figure viewed from the direction B in the FIG. 10A.

TABLE 3

| step No. | | 1 | 2 | 3 | 4 |
|---|---|---|---|---|---|
| etching time | | 6 sec | 16 sec | 170 sec | 30 sec |
| processing | CL2 | ○ | ○ | ○ | ○ |
| gas | O2 | — | — | ○ | — |
| | CO2 | ○ | ○ | — | ○ |
| | HBr | ○ | ○ | ○ | ○ |
| | Ar + CH4 | — | — | ○ | — |
| processing pressure | | 0.3 Pa | 0.3 Pa | 0.4 Pa | 0.1 Pa |
| plasma power/ duty/time | | 750 W/ 50% | 750 W/ 50% | high period 750 W/ 15%/ 0.15 ms low period 200 W/ 85%/ 0.85 ms | 600 W/ 100% |
| bias power/duty | | 300 W/ 40% | 300 W/ 40% | low period 120 W/ 80% | 40 W/ 50% |

The etching processing consists of four steps in this case. Cl2, O2, CO2, HBr, and Ar+CH4 gases are used as the processing gases, and mixture of these processing gases are used in each step as indicated in Table 3. In this gas system, a methane (CH4) gas is mixed for reducing the side etching during the etching as necessity.

Figure 9:
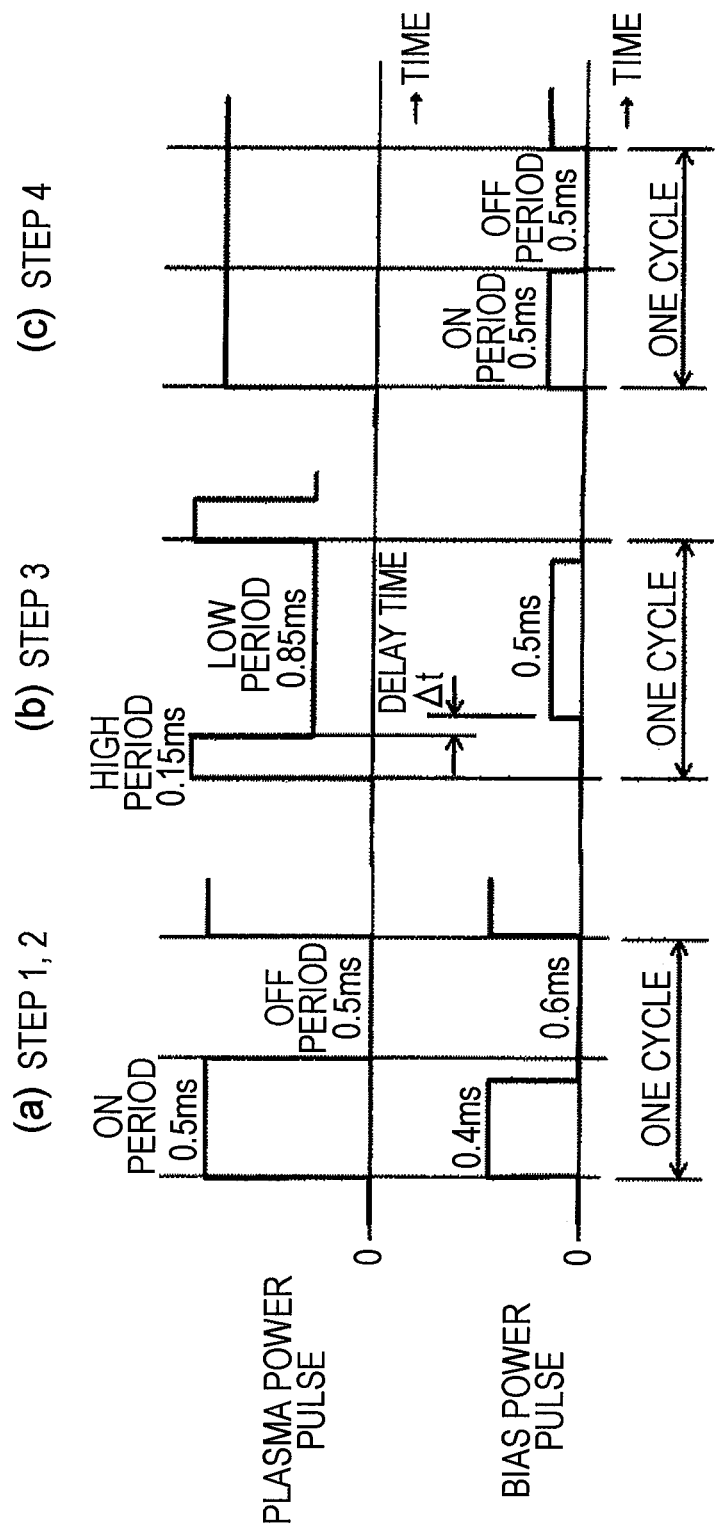
FIG. 9 is a timing chart illustrating a supplying state of plasma power and bias power according to the plasma processing method (Table 3) of a second embodiment of the present invention.

Table 3 indicates the value of the microwave power used for plasma generation in each step. FIG. 9 illustrates the supply timings of the microwaves. In Step 1, a natural oxidation film is removed. In Step 2, the Poly-Si film 304 is etched until the Fin 303 exposes. In Steps 1 and 2, as illustrated in FIG. 9 (a), the ON/OFF of the plasma power and the bias power are pulse controlled synchronously with frequency of 1 kHz and duty ratios of 50% and 40% respectively.

In Step 3, the Poly-Si film 304 is etch processed below the exposed part of the Fin 303. As illustrated in FIG. 9 (b), the bias power is applied synchronizing the low period of the plasma power in Step 3. The plasma power is set to high and low values and are time modulated and supplied alternatively. The parameters of the plasma power are 800 W and 200 W each having duty of 15% and 85% and the frequency is 1 kHz. In the present apparatus, the 2.45 GHz microwave is used as the plasma power, and the plasma is ignited when the output is approximately 400 W or more in this case. The bias power is synchronized with the plasma power with frequency of 1 kHz so that the bias power is supplied only during a low period of the plasma power, and is supplied with duty of 50%.

The delay time Δt of the bias power pulse is 0.05 ms in this case. In Step 4, an over-etching is performed for removing a residual substance. In Step 4, as illustrated in FIG. 9 (c), the plasma power is continuous and the bias power is pulse controlled (ON/OFF controlled) with pulse cycle of 1 kHz and duty of 50%.

FIGS. 10A to 10C illustrate sectional views of the wafer which is etch processed under the conditions mentioned above. According to the etching processing of the second embodiment, the circumference environment of the etching domain changes largely. That is, when the Fin 303 starts exposing by the etching process of Step 2, the etching area of the Poly-Si film 304 turns to an area excluding the area of Fin 303, while this area was not excluded from the etching area of the Poly-Si film 304 before the exposure of the Fin 303.

In the Step 3, a dense portion surrounded by the Poly-Si film 304 and the Fin 303 is etched as illustrated in FIG. 10C. The aspect ratio therefore becomes much larger and the etching environment changes largely compared to the environment in Step 2. Thus, the etching condition needs to be changed to a condition suitable for a narrow domain etching.

The etching profile is effected largely by the difference between isolation pattern and dense pattern of the lines when the Fin 303 is exposed. This is because the etched domain, or the etching space, becomes further narrower. In Step 3, the bias power is set small to prevent the Fin 303 from being sputter etched. Thus, protection of the side walls becomes important because the nature of the isotropic etching shall be considered. However, for purpose of decreasing the adhesion coefficient of the accumulative radical and supplying the radical to a narrow space and a deep space, the lowly dissociated plasma in the after-glow is maintained during the low period, after the plasma is generated in the high period.

The plasma power during the low period is 200 W, where the plasma is unable to be generated and maintained with an ordinary continuous discharge. However, the plasma generated in the high period can be maintained for a short period until the next high period. During this low period, low plasma density can be maintained. The bias power is supplied in the low period and the etching progresses during the low period.

This reduces the difference between the sparse portion, where the deposition is likely to occur, and the dense portion where the deposition hardly occurs. The excessive deposition in the sparse portion is thereby inhibited and this affords a vertical etching. Thus, the three dimensional Fin-FET can be etch processed with a sufficiently controlled profile.

As a comparative example of the second embodiment of the present invention, an etching processing of the similar three dimensional Fin-FET, under conditions shown in Table 4, will be discussed.

TABLE 4

| step No. | | 1 | 2 | 3 | 4 |
|---|---|---|---|---|---|
| etching time | | 6 sec | 16 sec | 86 sec | 30 sec |
| processing | CL2 | ○ | ○ | — | ○ |
| gas | O2 | — | — | ○ | ○ |
| | CO2 | ○ | ○ | — | — |
| | HBr | ○ | ○ | ○ | ○ |
| | Ar + CH4 | — | — | ○ | ○ |
| processing pressure | | 0.3 Pa | 0.3 Pa | 0.4 Pa | 0.1 Pa |
| plasma power/ duty/time | | 750 W/ 50% | 750 W/ 50% | 750 W/ 15% | 600 W/ 100% |
| bias power/duty | | 300 W/ 40% | 300 W/ 40% | 120 W/ 80% | 40 W/ 50% |

The process in Step 3 is different compared to the etching processing of the second embodiment. However, the other steps, i.e., Steps 1, 2, and 4 are similar to that of the second embodiment, and the detailed description will be omitted.

In Step 3, the plasma power is time modulated with ON/OFF as illustrated in FIG. 11 at switching frequency of 1 kHz and with duty ratio of 50%, and the plasma power is not time modulated with high and low values. The bias power is synchronized with the plasma power, and is time modulated so that the bias power is turned ON when the plasma power is ON at switching frequency of 1 kHz and with duty ratio of 50%.

Figure 12A:
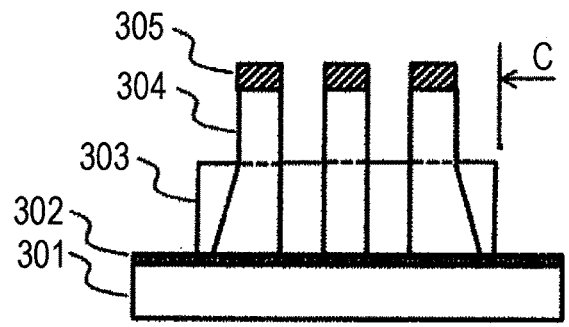
FIGS. 12A and 12B are longitudinal sectional views illustrating an etching profile of a sample processed by the etching condition of Table 4 using the electric power of FIG. 11.
Figure 12B:
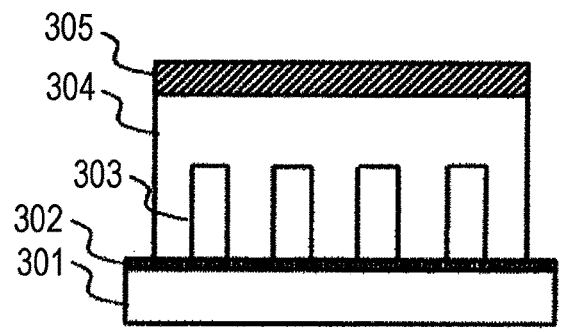

FIGS. 12A and 12B illustrate sectional views of the wafer which is etch processed under the conditions mentioned above. Since the components having the same reference number as in the FIGS. 10A to 10C are the same, the detailed description will be omitted. In the present comparative example, the plasma power is large when bias power is applied for etching processing in Step 3, and plasma density becomes large during this period. In this gas system, a methane (CH4) gas is mixed for reducing a side etching of the Poly-Si film side wall as discussed above.

Therefore, the number of CH radicals with high adhesion coefficient (radicals with large number of unconnected bonds) increases when the plasma density is high. This is because the collision frequency of the methane gas and the electron increases and a dissociation progresses such as from CH4 to CH+3H. When there are many high adhesive coefficient radicals, a tapered profile as illustrated in FIG. 12A is made. This is because the collision frequency of the radical increases at the side wall having a broader space facing the side wall of the Poly-Si film 304, and this side wall becomes thick.

According to the second embodiment, in addition to the advantage of the previous embodiment, there is an advantage that an etching processing with a lowly dissociated plasma is possible even in the three dimensional Fin-FET. This allows a control of the adhesive probability of the accumulative radicals and enables a vertical etching of the Poly-Si film without damaging the Fin even when the Fin is exposed.

Figure 13:
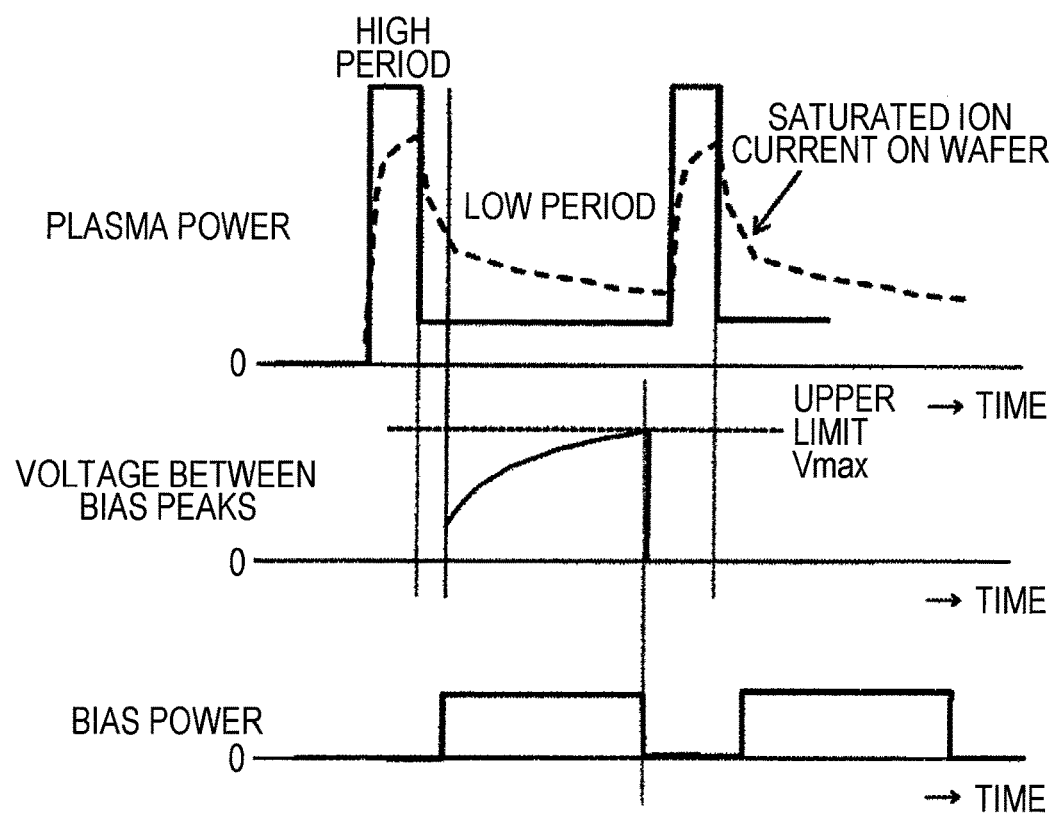
FIG. 13 is a timing chart illustrating an example of a control method of bias power according to the present invention.

In the above embodiments, the bias power pulse of a constant value is output so as to output the bias power of constant power. FIG. 13 is a timing chart illustrating a relation between a plasma power pulse, a voltage between bias peaks (referred to "Vpp" hereafter), and a bias power pulse. During the low period of the plasma power, although the after-glow is not extinguished, the saturation ion current decreases gradually. When a constant power source is used for supplying the bias power during this low period, the Vpp increases with the decrease of the saturation ion current.

The etching characteristic changes when the Vpp changes largely because the ion energy entering the wafer is substantially proportional to the Vpp. Therefore, the second radio frequency power supply 109 can be turned OFF by the controller 114, when the upper limit (Vmax) of the Vpp is determined and the Vpp reaches the Vmax, other than setting the duty ratio of the bias power. The etching characteristic can thereby be stabilized even when the Vpp changes.

Figure 14:
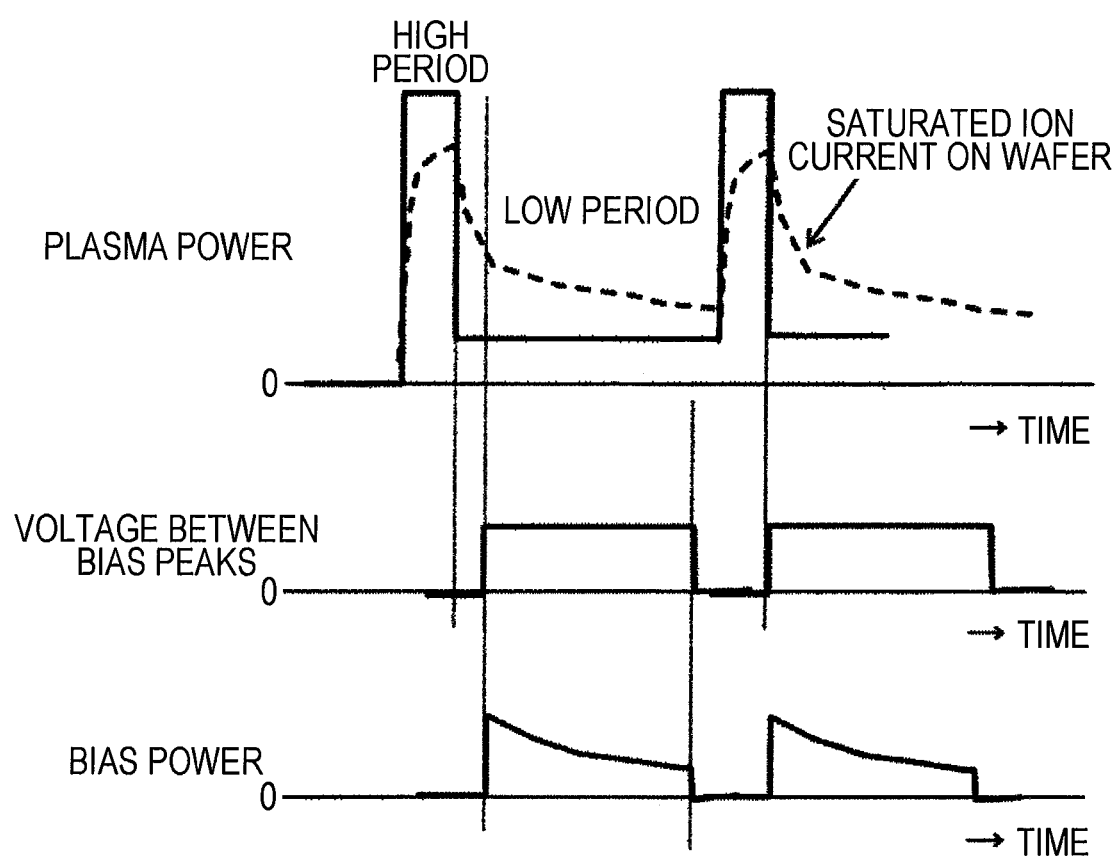
FIG. 14 is a timing chart illustrating another example of a control method of the bias power according to the present invention.

Another control method of the bias power will be discussed with reference to FIG. 14. FIG. 14 is a timing chart illustrating the relation between a plasma power pulse, a voltage between bias peaks (Vpp), and a bias power pulse. In contrast to FIG. 13, the Vpp is controlled to a constant value in FIG. 14. In this case, the controller 114 reduces the bias power corresponding to the decrease of the saturation ion current density, while the bias power pulse is ON for preventing the increase of the Vpp and controlling Vpp to a constant value. This allows a further stabilization of the etching characteristics because the Vpp, which effects the etching characteristics, can be kept constant.

In the above embodiments, a plasma etching apparatus using a magnetic field microwave source is employed. However, it cannot be overemphasized that the present invention can be applied for a plasma processing apparatus that uses the other type of plasma generating method such as the capacitive coupling type plasma source and the inductive coupling type plasma source. It is effective for obtaining the plasma of high generation efficiency and maintaining a long glow-discharge to form a magnetic field in a processing chamber during the plasma generation and to act the magnetic field.

Figure 15:
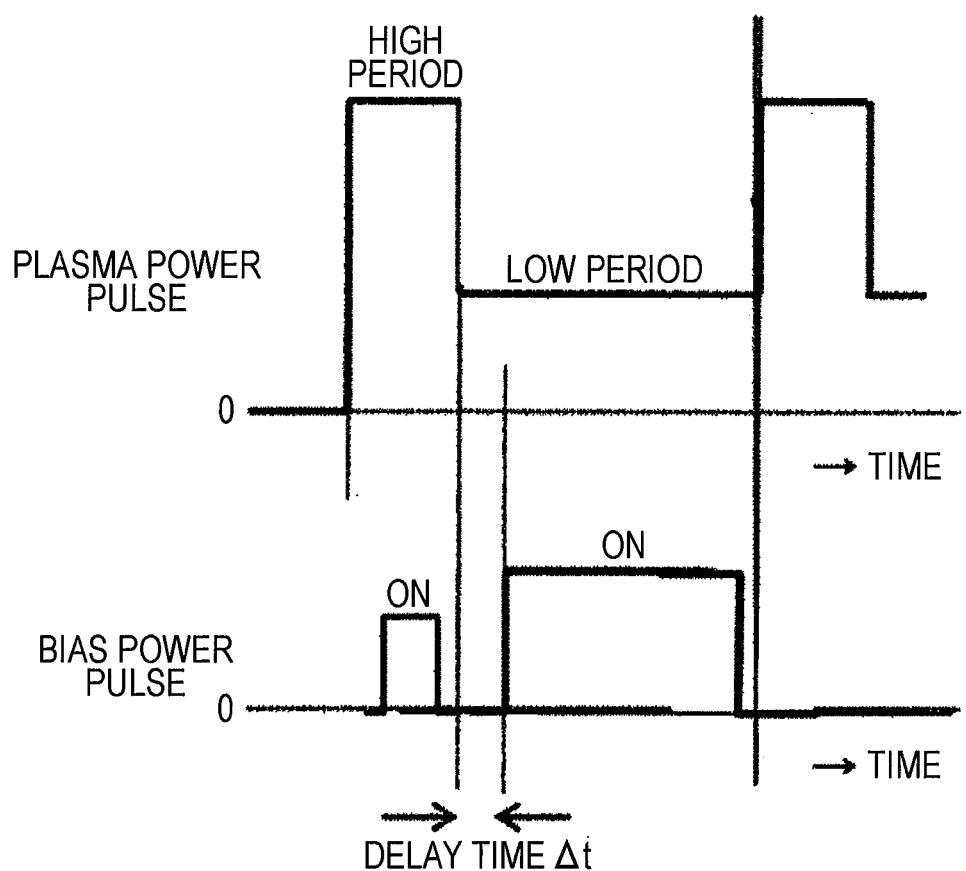
FIG. 15 is a timing chart illustrating another supplying method of the plasma power and the bias power according to the present invention.

In the present embodiment, the etching processing of the sample is made by entering the ion of lowly dissociated plasma into the wafer by supplying the bias power only during the low period of the plasma power. However, if the etching profile allows or the wafer damage is allowable, the bias power can be supplied also during the high period of the plasma power as illustrated in FIG. 15. In this case, the bias power output value can be set adequately according to the content of the processing during the high period and does not have to be adjusted with the bias power value of the low period. By doing so, the etching processing time can be shortened.

Similarly, if the etching profile allows or the wafer damage is allowable, an etching processing can be made by alternating a time where bias power is supplied only during the high period of the plasma power, and a time where bias power is supplied only during the low period of the plasma power, every 10 seconds.

The present invention allows a processing using the dissociated plasma of a desired degree and can broaden the process window. The invention also allows a microfabrication etching, and allows a vertical etching even when the etching surface has a difference between isolation pattern and dense pattern. The invention also allows an etching processing which is affordable even when the etched profile changes further smaller during the etching.

As mentioned above, the stability (reproducibility) of the processing is improved by alternatively performing a plasma processing during a low period supplied by bias power, and a plasma processing during a high period supplied by bias power. This is because a stable plasma processing during the high period is added to the processing.

The invention claimed is:

1. A plasma processing method comprising the steps of:
   supplying a first radio frequency electric power for generating plasma, the first radio frequency electric power being pulse-modulated with a first pulsed waveform having a first period and a second period;
   supplying a second radio frequency electric power to a sample stage on which a sample is mounted, the second radio frequency electric power being pulse-modulated with a second pulsed waveform having an on period and an off period;
   controlling to supply the first radio frequency electric power during the first period to generate the plasma and the first radio frequency electric power during the second period to maintain after-glow of the plasma without igniting the plasma;
   controlling a predetermined time delay between a start of the second period and a start of the on period;
   controlling the second period so as to include the on period;
   controlling the first radio frequency electric power during the second period so as to be greater than the second radio frequency electric power during the on period;
   controlling the second radio frequency electric power so as to only be supplied during the second period; and
   controlling to stop the second radio frequency electric power when a peak-to-peak voltage of a radio frequency voltage applied during the on period reaches a predetermined value.

2. The plasma processing method according to claim 1, wherein the time delay is 0.05 milliseconds.

3. The plasma processing method according to in claim 1, further comprising the step of:
   controlling to turn off output of the second radio frequency power supply when the peak-to-peak voltage of the radio frequency voltage during the on period reaches an upper limit (Vmax), which is the predetermined value.

4. The plasma processing method according to claim 1, wherein the off period includes the first period.

5. A plasma processing method comprising the steps of:
   supplying a first radio frequency electric power for generating plasma, the first radio frequency electric power being pulse-modulated with a first pulsed waveform having a first period and a second period;
   a second radio frequency power supply that supplies a second radio frequency electric power to a sample stage on which a sample is mounted, the second radio frequency electric power being pulse-modulated with a second pulsed waveform having an on period and an off period; and
   controlling to supply the first radio frequency electric power during the first period to generate the plasma and the first radio frequency electric power during the second period to maintain after-glow of the plasma;
   controlling the second period so as to include the on period;
   controlling the off period so as to include the first period; and
   controlling the second radio frequency electric power so as to only be supplied during the second period; and
   controlling to turn off output of the second radio frequency power supply when a peak-to-peak voltage of a radio frequency voltage applied during the on period reaches a predetermined value.

6. The plasma processing method according to claim 5, further comprising the step of:
   controlling a period of the first period so as to be smaller than a period of the second period.

7. The plasma processing method according to in claim 5, wherein the predetermined value is an upper limit (Vmax).

8. A plasma processing method comprising the steps of:
   supplying a first radio frequency electric power for generating plasma, the first radio frequency electric power being pulse-modulated with a first pulsed waveform having a first period and a second period;
   supplying a second radio frequency electric power to a sample stage on which the sample is mounted, the second radio frequency electric power being pulse-modulated with a second pulsed waveform having an on period and an off period;
   controlling to supply the first radio frequency electric power during the first period to generate the plasma and the first radio frequency electric power during the second period to maintain after-glow of the plasma without igniting the plasma;
   controlling the second period so as to include the on period;
   controlling the second radio frequency electric power so as to only be supplied during the second period;

controlling a period of the first period so as to be smaller than a period of the second period; and controlling to turn off output of the second radio frequency power supply when a peak-to-peak voltage of a radio frequency voltage applied during the on period reaches a predetermined value.

9. The plasma processing method according to claim 8, further comprising the step of:

controlling the off period so as to include the first period.

10. The plasma processing method according to claim 8, further comprising the step of:

controlling a period of the first period so as to be smaller than a period of the on period.

11. The plasma processing method according to claim 10, further comprising the step of:

controlling a period of the on period so as to be longer than a period of the off period.

12. The plasma processing method according to claim 11, further comprising the step of:

controlling a period of the second period so as to be longer than a period of the off period.

13. The plasma processing method according to claim 8, wherein the predetermined value is an upper limit (Vmax).

* * * * *